United States Patent [19]

Yasuda et al.

[11] Patent Number: 4,487,795
[45] Date of Patent: Dec. 11, 1984

[54] METHOD OF FORMING PATTERNED CONDUCTOR LINES

[75] Inventors: Hiroshi Yasuda; Yasutaka Ban, both of Yokohama, Japan

[73] Assignee: Fujitsu Limited, Kawasaki, Japan

[21] Appl. No.: 363,857

[22] Filed: Mar. 31, 1982

[30] Foreign Application Priority Data

Mar. 31, 1981 [JP] Japan ................................. 56-46371

[51] Int. Cl.$^3$ ........................... B32B 3/24; G03C 5/00
[52] U.S. Cl. .................................... 428/138; 428/195; 428/209; 428/901; 430/296; 430/313; 430/318; 430/320; 430/326
[58] Field of Search ............... 430/296, 313, 318, 320, 430/326; 428/195, 209, 131, 132, 137, 138, 901, 139, 140

[56] References Cited

U.S. PATENT DOCUMENTS 3,799,777  3/1974  O'Keefe et al. ..................... 430/296
4,355,094 10/1982  Pampalone et al. ................ 430/296

Primary Examiner—Bruce H. Hess
Attorney, Agent, or Firm—Staas & Halsey

[57] ABSTRACT

A conductor pattern consisting of conductor lines is formed in an electronic device by an electron-beam lithography process using a positive resist. After the formation of a positive resist layer on a conductive layer, a linear pattern of latent images is formed by exposure of an electron-beam along the contours of the conductor lines to be formed. The positive resist layer is developed and then serves as a mask against an etchant. The conductive layer is selectively etched to divide it into the patterned conductor lines and remaining conductor portions.

4 Claims, 6 Drawing Figures

METHOD OF FORMING PATTERNED CONDUCTOR LINES

BACKGROUND OF THE INVENTION

1. Field of the Invention

The present invention relates to a method of forming patterned conductor lines (i.e. a conductor pattern) of an electronic device, such as a semiconductor device, a magnetic bubble memory, a thin film hybrid integrated circuit or a thin film magnetic head, by using an electron-beam lithography technique.

2. Description of the Prior Art

The electron-beam lithography technique was researched and developed for the microfabrication of denser semiconductor devices (such as integrated circuits (IC's) and large-scale integrated circuits (LSI's)). Negative electron-sensitive resist and positive electron-sensitive resist are used as the medium for pattern resolution. In general, negative resist is characterized by high sensitivity, while positive resist is characterized by high resolution. In actual microfabrication process, since conductor lines are formed on an IC or LSI chip by etching a relatively large portion of the conductive layer, negative resist is most often used for formation of conductor lines. On the other hand, since through hole are formed in an insulating layer of an IC or LSI chip by etching a small portion of the insulating layer, positive resist is most often used for formation of through holes.

Electron-sensitive resist is disclosed in publications such as M. Hatzakis, "Recent Developments in Electron-Resist Evaluation Techniques", Journal of Vacuum Science Technology, Volume 12 (1975), No. 6, page 1276 to 1279, and J.Shimada, "Kinds and Properties of Resist for Electron-Beam Exposure", Electronic Parts and Material, Volume 18 (1979), No. 10, page 28 to 34.

SUMMARY OF THE INVENTION

An object of the present invention is to provide a method of forming patterned conductor lines (i.e., a conductor pattern) wherein the total exposure area of the electron beam is reduced as compared with conventional methods.

Another object of the present invention is to increase conductor line density.

The above-mentioned objects are attained by providing a method of forming patterned conductor lines comprising the steps of: forming an electron-sensitive resist layer on a conductive layer; exposing the resist layer with an electron-beam; developing the resist layer; and selectively etching the conductive layer, by using the resist layer as a mask, to form the conductor lines; in which method, according to the present invention, the electron-sensitive resist layer is made of a positive resist and the portion of the positive resist corresponding to contours of the conductor lines to be formed in linearly exposed with the electron-beam.

In accordance with the method of the present invention, the conductive layer is divided into the patterned conductor lines and remaining conductor portions by removing the portion of the conductive layer corresponding to the exposure portion of the positive resist. Namely, since the electron-beam draws a line along the contours of the conductor lines to be formed, the conductor lines and the remaining conductor portions are separated from each other by the etched line of the conductive layer.

It is preferable to use a positive electron-sensitive resist, such as polymethyl methacrylate (PMMA), polybutene sulfone (PBS), polyhexafluorobutyl methacrylate (FBM), and AZ series resist (commercially available from Shipley).

DETAILED DESCRIPTION OF THE INVENTION

Figure 1:
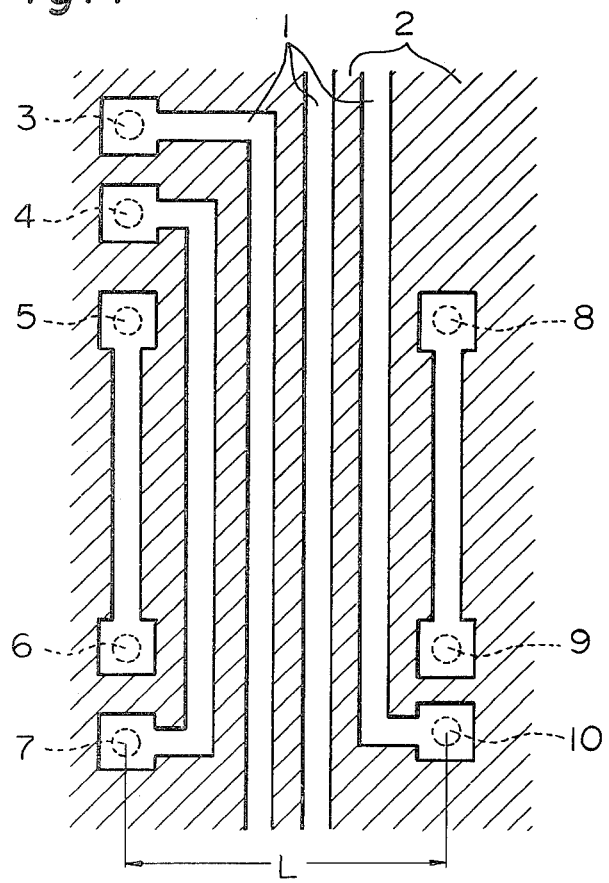
FIG. 1 is a partial plan view of a conductor pattern formed by using a negative resist according to the conventional method.

Referring now to FIG. 1, there is shown a partial plan view of a conductor pattern formed by using a negative electron-sensitive resist layer according to the conventional method. In FIG. 1, the reference numerals 1, 2, and 3 through 10 indicate patterned conductor lines, the portion of an insulating layer (shaded portion in drawing) exposed by selectively etching the conductive layer, and through holes for contact with underlying conductor lines or impurity-doped regions of the semiconductor substrate.

Figure 2:
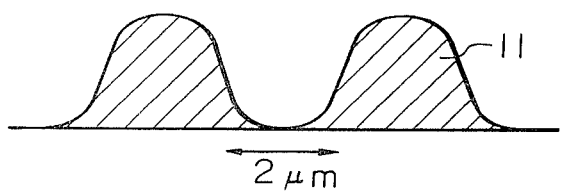
FIG. 2 is a sectional view of a developed negative resist layer.

The conventional method for the formation of the conductor pattern illustrated in FIG. 1 is as follows: An insulating layer 2 of, e.g., silicon dioxide ($SiO_2$) is formed on a semiconductor substrate, i.e., a silicon (Si) wafer (not shown) by a conventional process (e.g., thermal oxidation process or chemical vapor deposition process). The through holes 3 through 10 are formed in the insulating layer 2 by using a positive electron-sensitive resist in accordance with the prior art. A conductive layer of, e.g., aluminum (Al) is formed on the insulating layer 2 by a suitable process (e.g., a vacuum evaporation process). Then, a negative electron-sensitive resist (e.g., OMR-83 commercially available from Tokyo Ohka Kogyo Co., Ltd.) having a thickness of, e.g., 1.8 μm, is coated on the conductive layer and is prebaked. The negative resist layer is exposed with an electron-beam (e.g., at an acceleration potential of 20 kV, an exposure charge density of $1 \times 10^{-5}$ C/cm$^2$) to form a pattern of latent images corresponding to the conductor lines in the negative resist layer. The negative resist layer is developed, rinsed, and postbaked to form a patterned resist layer 11, as illustrated in FIG. 2. The developed resist layer 11 has a thickness of 1.5 μm. The 1.5 μm thick resist layer enables plasma-etching of an aluminum layer of 1.0 μm or less thickness. Since OMR and other negative resist have low resolution, a bell-shaped line profile is caused in the negative resist layer 11, as illustrated in FIG. 2. This bell-shaped profile means that in order to form a pattern of conductor lines having a linewidth of, e.g., 2 μm, one has to space the conductor lines (i.e., provide a distance between adjacent edges of two conductor lines) by at least 2 μm.

Then, in the conventional method, the conductive layer is selectively etched by a suitable etching process (e.g., a gas plasma etching process using CCl$_4$ or BBr$_3$). During the etching, the patterned negative resist layer 11 serves as a mask. Thus, the patterned conductor lines 1 are formed, as illustrated in FIG. 1. Finally the remaining negative resist layer 11 is removed.

When a conductor pattern is formed comprising six conductor lines 1 of 2 μm width each and five spaces between conductor lines of 2 μm each, as illustrated in FIG. 1, the distance L from the row of through holes 3 through 7 to the row of through holes, 8, 9, and 10 is 22 μm.

Figure 3:
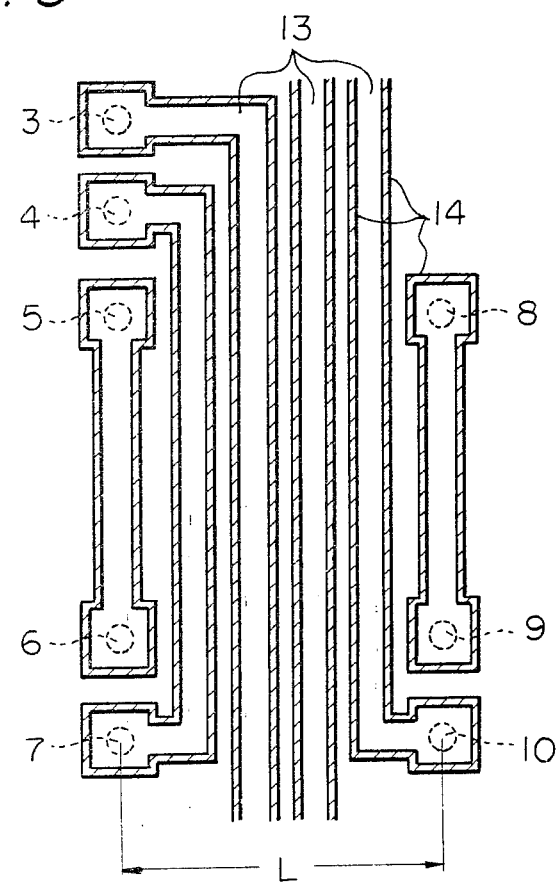
FIG. 3 is a partial plan view of a conductor pattern corresponding to that of FIG. 1 and formed by using a positive resist according to the present invention.

FIG. 3 is a partial plan view of the same conductor pattern as FIG. 1, but formed by using a positive electron-sensitive resist layer in accordance with the present invention. In FIG. 3, reference numerals 13 and 14 indicate patterned conductor lines having the same shape as that of conductor lines 1 of FIG. 1 and the portion of an insulating layer (shaded portion in drawing) exposed by selectively etching the conductor layer. The through holes 3 through 10 are formed at the same positions as in FIG. 1.

Figure 4:
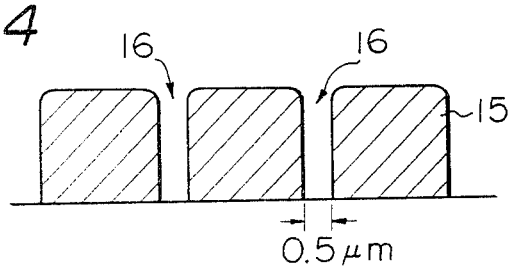
FIG. 4 is a sectional view of a developed positive resist layer.

The method of the present invention for the formation of the conductor pattern illustrated in FIG. 3 is as follows: A conductive layer of, e.g., aluminum is formed on an insulating layer 2 of, e.g., silicon dioxide lying on a semiconductor substrate and having through holes 3 through 10, as mentioned above. A positive electron-sensitive resist (e.g., PMMA) having a thickness of, e.g., 2 μm is coated on the conductive layer and is prebaked (e.g., at 170° C. for 40 minutes). Then, the positive resist layer is exposed with an electron-beam (e.g., at an acceleration potential of 20 kV, an exposure charge density of $1 \times 10^{-5}$ C/cm$^2$) to form a pattern of latent images in the positive resist layer. The latent image pattern is formed of a line drawn along contours of the conductor lines to be formed by a round point-beam system or a rectingular linked-beam system. For example, a large number of rectangular spot beams having a spot size of, e.g. 0.5 μm × 3.0 μm can be linked so as to make a line of 0.5 μm width. The positive resist layer is developed with a suitable developer (e.g., methyl-isobutyl-ketone), rinsed with a suitable rinse (e.g., isopropyl alcohol), and postbaked (e.g., at 120° C. for 1 hour). Since PMMA and other positive resist have superior resolution, the exposed portion of the positive resist layer 15 can be precisely removed to form a narrow groove 16, as illustrated in FIG. 4. For example, it is possible to form a narrow groove 16 of 0.5 μm width, thereby enabling later formation of as narrow as 0.5 μm spaces conductor lines. Then, the portion of the conductive layer not covered with the developed positive resist layer is removed by a suitable etching process (e.g. a gas plasma etching process using CCl$_4$ or BBr$_3$) to form the conductor lines 13 (FIG. 3) and the remaining conductor portions. The remaining conductor portions of the conductive layer (e.g., aluminum layer) serve as a protective mask against undesirable impurities (such as alkaline ions) or α-rays for active elements and passive elements formed in a semiconductor substrate. Therefore, the remaining conductor portions improves the stabilization and reliability of a semiconductor device.

When a conductor pattern is formed in accordance with the method of the present invention instead of the conventional method using a negative electron-sensitive resist, the exposure area can be reduced by 50%. Accordingly, the exposure period can be also reduced. If the positive electron-sensitive resist is used for the formation of the conductor pattern occupying a relatively small part of a chip, the exposure period of an electron-beam becomes very long due to a large area, except for the conductor pattern part, to be exposed. On the other hand, according to the present invention a border along contours of the patterned conductor lines is exposed, so that the exposure area is very small.

Figure 5:
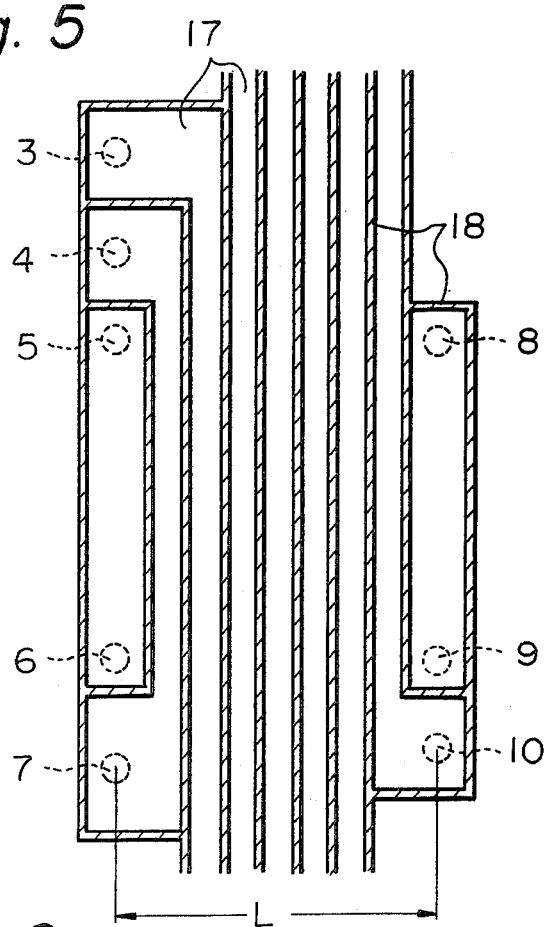
FIG. 5 is a partial plan view of another conductor pattern formed by using a positive resist according to the present invention.

FIG. 5 shows a partial plan view of another conductor pattern formed in accordance with the proposed method of the present invention. Reference numerals 17 and 18 indicate patterned conductor lines and the exposed portion of the insulating layer. The through holes 3 through 10 are formed at the same positions as in FIG. 1.

The conductor pattern illustrated in FIG. 5 is formed in the same manner as that mentioned for FIG. 3, except that the pattern drawn with the electron-beam is different from that of FIG. 2.

Figure 6:
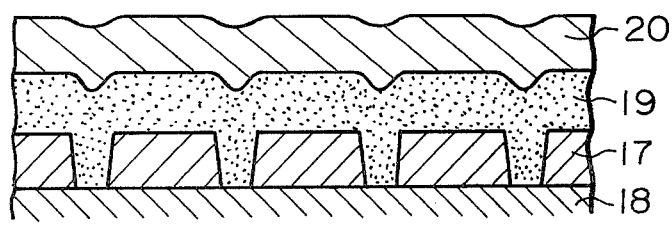
FIG. 6 is a sectional view of a multilayer structure of conductor lines formed by using the other conductor pattern of FIG. 5.

Since a conductor line of 2 μm width and a space between conductor lines of 0.5 μm can be formed by using the positive electron-sensitive resist, it is possible to form nine conductor lines within the distance L (22 μm) between the rows of through holes, as illustrated in FIG. 5. Namely, it is possible to increase the number of conductor lines formed under the same conditions, i.e., the width of the conductor lines and arrangement of through holes, as in the conventional case. Accordingly, the formation method of the present invention can contribute toward the increase of integration degree. In case of the use of a master slice for the production of an IC for a logic function, since the region for conductor lines is predetermined, it is difficult to produce a complicated logic IC with the conventional method. The present invention facilitates the production of complicated logic IC's. Furthermore, as illustrated in FIG. 6, when another insulating layer 19 of, e.g., phosphosilicate glass (PSG) is formed on the conductor lines 17 (FIG. 5) and on the exposed portion 18 of the insulating layer, the surface profile of the other insulating layer 19 can be made smoother as compared with the conventional case, since the space between conductor lines is small (e.g., 0.5 μm). Another conductor line 20 of, e.g., aluminum can be formed on the other insulating layer 19 to form a multilayer structure of conductor lines. In this case, the other conductor line 20 can be formed without cracks or breakdown, which generally occur at an edge of a step of an uneven surface.

It will be obvious that the present invention is not restricted to the above-mentioned embodiments, and that many variations are possible for those skilled in the art without departing from the spirit and scope of the invention. For example, the method of the present invention can be also applied to the formation of patterned conductor lines of a magnetic bubble memory, a thin film hybrid integrated circuit or a thin film magnetic head. In the case of production of dynamic random-access memory IC's comprising one-transistor one-capacitor cells, undesirable parasitic capacity occurs due to the remaining conductor portions of the conductive layer. According to the present invention, the remaining conductor portions can be selectively removed by exposing the corresponding part of the positive resist layer and etching, thereby preventing the parasitic capacity from occurring.

We claim:

1. An electronic device comprising:
   (a) a substrate;
   (b) an insulating layer formed on the substrate and having through holes formed therein;
   (c) a conductive layer formed on the insulating layer, said conductive layer comprising patterned conductor lines and remaining conductor portions, said patterned conductor lines and remaining conductor portions defined by forming a positive electron-sensitive resist layer on said conductive layer, selectively exposing the positive electron-sensitive resist layer to an electron beam to define linear latent images corresponding to contours of said patterned conductor lines, and removing the exposed area of the resist layer, wherein, the patterned conductor lines are electrically connected with other conductor lines or predetermined portions of the substrate through the through holes formed in the insulating layer and the remaining conductor portions are electrically isolated so that current does not flow in the remaining conductor portions.

2. A method of forming patterned conductor lines of an electronic device having a substrate, comprising the steps of:
   (a) forming an insulating layer on the substrate;
   (b) forming through holes in the insulating layer;
   (c) forming a conductive layer on the insulating layer;
   (d) forming a positive electron-sensitive resist layer on said conductive layer;
   (e) exposing said resist layer with an electron beam to form a latent image pattern of a line drawn along the contours of the patterned conductor lines to be formed, in said resist layer;
   (f) developing said resist layer;
   (g) removing the portion of said conductive layer, not covered with said developed resist layer, by etching, to divide said conductive layer into said patterned conductor lines and remaining conductor portions separated by the removed portion; and
   (h) removing said developed resist layer, wherein the patterned conductor lines are electrically connected with other conductor lines or predetermined portions of the substrate through the through holes formed in the insulating layer and the remaining conductor portions are electrically isolated so that current does not flow in the remaining conductor portions.

3. A method according to claim 2, wherein the width of said removed portion corresponds to the width of the exposure line of said electron-beam.

4. A method according to claim 2, wherein said substrate has an insulating layer thereon.

* * * * *